(12) United States Patent
Naem

(10) Patent No.: US 8,030,733 B1
(45) Date of Patent: *Oct. 4, 2011

(54) COPPER-COMPATIBLE FUSE TARGET

(75) Inventor: Abdalla Aly Naem, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 378 days.

This patent is subject to a terminal disclaimer.

(21) Appl. No.: 11/805,056

(22) Filed: May 22, 2007

(51) Int. Cl.
*H01L 23/62* (2006.01)

(52) U.S. Cl. . 257/529; 257/209; 257/729; 257/E23.149; 257/E21.592; 438/128; 438/129

(58) Field of Classification Search .................. 257/762, 257/209, 529, E21.592, 50, 413, 430, E23.149, 257/530; 438/132, 215, 281, 333, 601, 467, 438/600, 710, 128, 129, 700; 337/142, 251; 365/96, 104, 177, 184
See application file for complete search history.

(56) References Cited

U.S. PATENT DOCUMENTS

| | | | |
|---|---|---|---|
| 5,254,493 A | 10/1993 | Kumar | |
| 5,550,405 A | 8/1996 | Cheung et al. | |
| 5,652,459 A * | 7/1997 | Chen | 257/529 |
| 5,728,594 A | 3/1998 | Efland et al. | 437/40 |
| 5,891,805 A | 4/1999 | Cheng et al. | |
| 6,020,640 A | 2/2000 | Efland et al. | 257/751 |
| 6,025,275 A | 2/2000 | Efland et al. | 438/722 |
| 6,046,071 A | 4/2000 | Sawai et al. | |
| 6,090,697 A | 7/2000 | Xing et al. | |
| 6,133,133 A | 10/2000 | Givens | |
| 6,140,150 A | 10/2000 | Efland et al. | 438/106 |
| 6,140,702 A | 10/2000 | Efland et al. | 257/762 |
| 6,150,722 A | 11/2000 | Efland et al. | 257/762 |
| 6,197,688 B1 | 3/2001 | Simpson | 438/678 |
| 6,236,101 B1 | 5/2001 | Erdeljac et al. | 257/531 |
| 6,294,474 B1 * | 9/2001 | Tzeng et al. | 438/710 |
| 6,316,359 B1 | 11/2001 | Simpson | 438/678 |
| 6,372,586 B1 | 4/2002 | Efland et al. | 438/301 |
| 6,392,300 B1 | 5/2002 | Koike | |
| 6,407,453 B1 | 6/2002 | Watanabe et al. | |
| 6,521,533 B1 | 2/2003 | Morand et al. | 438/687 |
| 6,528,419 B1 | 3/2003 | Kordic et al. | 438/675 |
| 6,559,548 B1 | 5/2003 | Matsunaga et al. | |
| 6,638,792 B2 | 10/2003 | Hui et al. | 438/118 |
| 6,713,381 B2 | 3/2004 | Barr et al. | |
| 6,713,835 B1 | 3/2004 | Horak et al. | |
| 6,743,719 B1 | 6/2004 | Chen et al. | 438/658 |
| 6,750,553 B2 | 6/2004 | Abesingha et al. | 257/787 |
| 6,856,019 B2 | 2/2005 | Tamaru et al. | |

(Continued)

OTHER PUBLICATIONS

U.S. Appl. No. 11/643,243, filed Dec. 21, 2006 to Shahram Mostafazadeh et al.

(Continued)

*Primary Examiner* — Cuong Q Nguyen
*Assistant Examiner* — Yosef Gebreyesus
(74) *Attorney, Agent, or Firm* — Mark C. Pickering

(57) ABSTRACT

A copper-compatible fuse target is fabricated by forming a copper target structure at the same time that the copper traces are formed. After the copper target structure and the copper traces have been formed, a conductive target, such as an aluminum target, is formed on the copper target structure at the same time that conductive connection portions, such as aluminum pads, are formed on the copper traces. A trench is then etched around the copper target structure and conductive target to form a fuse target.

18 Claims, 17 Drawing Sheets

U.S. PATENT DOCUMENTS

| | | | |
|---|---|---|---|
| 6,943,101 B2 | 9/2005 | Brintzinger | |
| 7,071,024 B2 | 7/2006 | Towle et al. | |
| 7,087,991 B2 | 8/2006 | Chen et al. | |
| 7,101,809 B2 | 9/2006 | Jo | 438/754 |
| 7,105,917 B2 * | 9/2006 | Cho et al. | 257/678 |
| 7,132,297 B2 | 11/2006 | Griglione et al. | |
| 7,247,555 B2 | 7/2007 | Cong et al. | |
| 7,262,126 B2 | 8/2007 | Bojkov et al. | |
| 7,271,013 B2 | 9/2007 | Yong et al. | 438/14 |
| 7,323,406 B2 | 1/2008 | Lim et al. | 438/622 |
| 2001/0042897 A1 * | 11/2001 | Yeh et al. | 257/529 |
| 2002/0102831 A1 | 8/2002 | Hui et al. | |
| 2002/0155672 A1 * | 10/2002 | Wang et al. | 438/333 |
| 2003/0025173 A1 | 2/2003 | Suminoe et al. | |
| 2003/0076715 A1 * | 4/2003 | Ikuta et al. | 365/200 |
| 2003/0160261 A1 * | 8/2003 | Moriya | 257/127 |
| 2003/0173675 A1 | 9/2003 | Watanabe et al. | |
| 2003/0205810 A1 | 11/2003 | Usami | |
| 2004/0026786 A1 | 2/2004 | Leu et al. | |
| 2004/0070042 A1 | 4/2004 | Lee et al. | |
| 2005/0017355 A1 | 1/2005 | Chou et al. | |
| 2005/0090071 A1 | 4/2005 | Dower et al. | |
| 2005/0098903 A1 | 5/2005 | Yong et al. | |
| 2005/0121788 A1 | 6/2005 | Watanabe et al. | |
| 2005/0127447 A1 | 6/2005 | Jo | |
| 2005/0194683 A1 | 9/2005 | Yu et al. | |
| 2005/0218527 A1 | 10/2005 | Watanabe | |
| 2005/0245076 A1 * | 11/2005 | Bojkov et al. | 438/643 |
| 2006/0001170 A1 | 1/2006 | Zhang et al. | |
| 2006/0012046 A1 | 1/2006 | Koura et al. | |
| 2006/0157854 A1 | 7/2006 | Takewaki et al. | |
| 2006/0166402 A1 | 7/2006 | Lim et al. | |
| 2006/0202346 A1 | 9/2006 | Shih et al. | |
| 2006/0214260 A1 * | 9/2006 | Cho et al. | 257/529 |
| 2007/0181968 A1 * | 8/2007 | Kim | 257/529 |
| 2007/0205520 A1 | 9/2007 | Chou et al. | |
| 2008/0105947 A1 | 5/2008 | Kuzuhara et al. | |

OTHER PUBLICATIONS

U.S. Appl. No. 11/592,926, filed Nov. 3, 2006 to Abdalla Aly Naem.
U.S. Appl. No. 11/805,058, filed May 22, 2007, Naem.
U.S. Appl. No. 11/805,054, filed May 22, 2007, Naem et al.
U.S. Appl. No. 11/805,054 to Abdalla Aly Naem et al filed May 22, 2007.
U.S. Appl. No. 11/805,058 to Abdalla Aly Naem filed May 22, 2007.
U.S. Appl. No. 12/283,852 to Abdalla Aly Naem et al filed Sep. 15, 2008.
U.S. Appl. No. 11/592,926 to Abdalla Aly Naem filed Nov. 3, 2006.
U.S. Appl. No. 11/643,243 to Shahram Mostafazadeh et al filed Dec. 21, 2006.

* cited by examiner

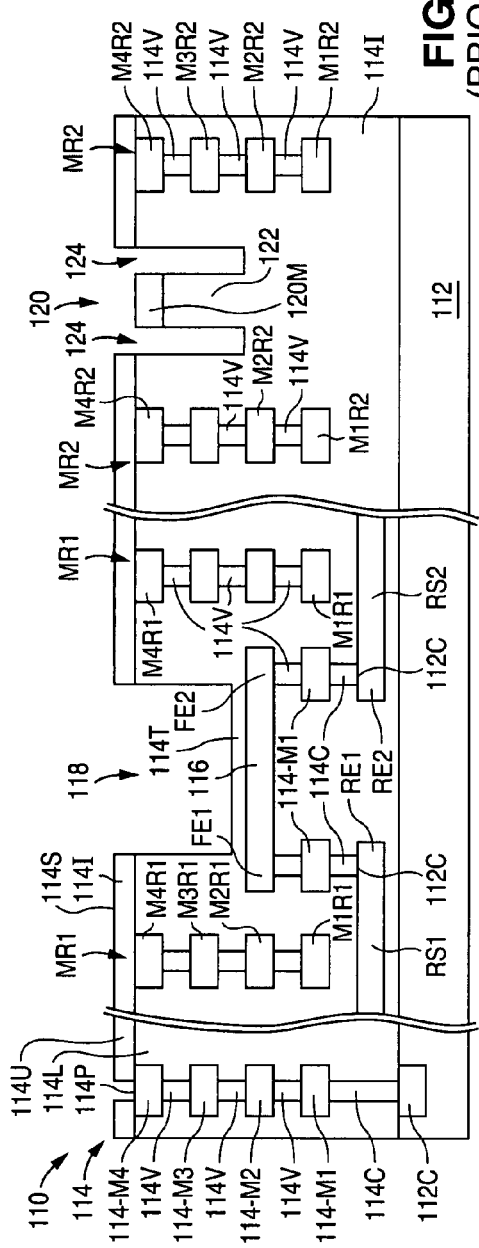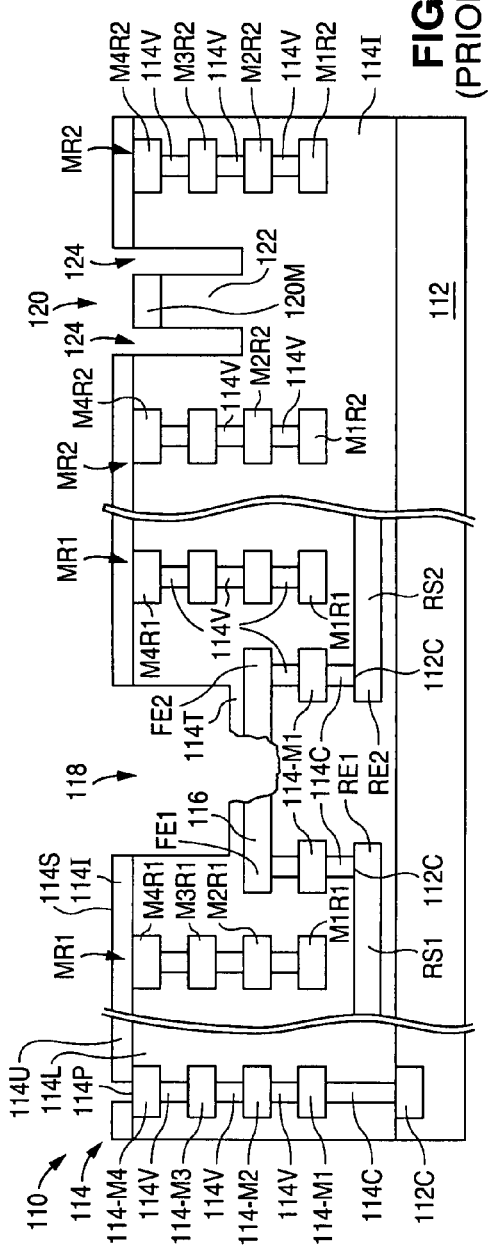
FIG. 1B (PRIOR ART)
FIG. 1C (PRIOR ART)

COPPER-COMPATIBLE FUSE TARGET

BACKGROUND OF THE INVENTION

1. Field of the Invention

The present invention relates to a fuse target and, more particularly, to a copper-compatible fuse target and a method of forming the copper-compatible fuse target.

2. Description of the Related Art

A fuse is a device that provides a low-resistance current path between two conductive lines when the fuse is unprogrammed, and a high-resistance current path between the two conductive lines when the fuse is programmed. Fuses are commonly used to trim semiconductor devices, such as resistors, to form precision analog devices.

A fuse target is a device that has a unique signature which can be detected by an optical recognition system. For example, an optical recognition system can detect the shape and reflectivity of a fuse target, and then determine the position of the fuse target. The fuse target has a known positional relationship with respect to the semiconductor fuse. As a result, the position of the semiconductor fuse can be determined from the position of the fuse target.

FIGS. 1A-1C show views that illustrate a prior-art semiconductor wafer 110 with a fuse and a fuse target. FIG. 1A shows a plan view, while FIGS. 1B and 1C show cross-sectional views taken along line 1B-1B of FIG. 1A. As shown in FIGS. 1A-1C, semiconductor wafer 110 includes a semiconductor substrate 112 and a metal interconnect structure 114 that is connected to semiconductor substrate 112.

Semiconductor substrate 112 includes a number of structures that are formed in and on substrate 112. The structures, which include resistors, transistors, capacitors, diodes, and similar devices, have a number of conductive contact regions 112C, such as the ends of a resistor and the terminals of a transistor. In the present example, the resistors include a trim resistor that has a first polysilicon resistive segment RS1 with a conductive contact region 112C at an end RE1, and a second polysilicon resistive segment RS2 with a conductive contact region 112C at an end RE2.

Metal interconnect structure 114, in turn, is a multi-layered structure that electrically interconnects together the various devices that are formed on substrate 112 to realize an electrical circuit. Metal interconnect structure 114 includes a number of contacts 114C that touch the conductive contact regions 112C (either directly or via silicide).

Metal interconnect structure 114 also includes a number of metal-1 traces 114-M1 that are connected to the contacts 114C, a number of metal-2 traces 114-M2, a number of metal-3 traces 114-M3, and a number of metal-4 traces 114-M4. In the present example, the metal-1 traces 114-M1, the metal-2 traces 114-M2, the metal-3 traces 114-M3, and the metal-4 traces 114-M4 are implemented with aluminum. Further, selected regions on the top surfaces of the metal-4 traces 114-M4 are exposed to the external world, and function as bond pads 114P that provide an external electrical connection point.

In addition, metal interconnect structure 114 includes a number of inter-metal vias 114V that connect the metal-1 traces 114-M1 and the metal-2 114-M2 traces together, the metal-2 traces 114-M2 and the metal-3 114-M3 traces together, and the metal-3 traces 114-M3 and the metal-4 114-M4 traces together.

Metal interconnect structure 114 further includes a planarized insulation region 114I that touches semiconductor substrate 112, the conductive contacts 114C, the metal-1 traces 114-M1, the metal-2 traces 114-M2, the metal-3 traces 114-M3, the metal-4 traces 114-M4, and the inter-metal vias 114V. In the present example, insulation region 114I includes a region of oxide 114L and an overlying passivation layer 114U. Passivation layer 114U, which has a top surface 114S, can be implemented with, for example, oxide, nitride, or a combination of oxide and nitride.

Metal interconnect structure 114 further includes a fuse 116 which has a first end FE1 and a second end FE2. First end FE1 makes an electrical connection with the structure to be trimmed which, in the present example, is end RE1 of polysilicon resistive segment RS1 of the trim resistor. Similarly, second end FE2 makes an electrical connection with the structure to be trimmed which, in the present example, is end RE2 of polysilicon resistive segment RS2 of the trim resistor. Fuse 116 is illustrated in the present example as a short thin metal-2 trace, although fuse 116 can be implemented in other metal layers.

In addition, metal interconnect structure 114 includes a stacked metal ring structure MR1 that is formed around fuse 116 to protect adjacent regions of wafer 110 from fuse 116 during programming. Metal ring structure MR1 includes a metal-1 trace 114-M1 that is formed around fuse 116 as a metal-1 ring M1R1, and a metal-2 trace 114-M2 that is formed around fuse 116 as a metal-2 ring M2R1. Further, metal ring structure MR1 includes a metal-3 trace 114-M3 that is formed around fuse 116 as a metal-3 ring M3R1, and a metal-4 trace 114-M4 that is formed around fuse 116 as a metal-4 ring M4R1.

The metal rings M1R1, M2R1, M3R1, and M4R1 are electrically connected together by way of a number of inter-metal vias 114V, but are electrically isolated from all other conducting structures. (Only one fuse 116 is shown for clarity. A large number of fuses 116 can lie within stacked metal ring MR1 (a bank of fuses), and wafer 110 can include a large number of fuse banks.) Metal interconnect structure 114 also includes a fuse opening 118 in planarized insulation region 114I that exposes a thin layer 114T of planarized insulation region 114I that lies on fuse 116.

In addition, metal interconnect structure 114 includes a fuse target 120 that has a known positional relationship with fuse 116. (Only one fuse target 120 is shown for clarity. Fuse targets are commonly located in the corners of a region that surround the fuse banks.) In the present example, fuse target 120 is illustrated as an exposed, electrically-isolated, L-shaped metal-4 trace 120M that sits on a pedestal 122 surrounded by a trench 124.

Metal interconnect structure 114 further includes a stacked metal ring structure MR2 that is formed around fuse target 120 to protect adjacent regions of wafer 110 from fuse target 120 during the formation of fuse opening 118 and trench 124. Metal ring structure MR2 includes a metal-1 trace 114-M1 that is formed around fuse target 120 as a metal-1 ring M1R2, and a metal-2 trace 114-M2 that is formed around fuse target 120 as a metal-2 ring M2R2.

Metal ring structure MR2 also includes a metal-3 trace 114-M3 that is formed around fuse target 120 as a metal-3 ring M3R2, and a metal-4 trace 114-M4 that is formed around fuse target 120 as a metal-4 ring M4R2. The metal rings M1R2, M2R2, M3R2, and M4R2 are electrically connected together by way of a number of inter-metal vias 114V, but are electrically isolated from all other conducting structures.

In operation, in the native or unprogrammed state, which is shown in FIG. 1B, fuse 116 provides a low-resistance current path between the resistive segments RS1 and RS2. To program fuse 116, an optical recognition system is used to detect the shape and reflectivity of fuse target 120, and then determine the position of fuse target 120. Once fuse target 120 has been located, the position of fuse 116 is determined from the known positional relationship.

After the position of fuse 116 has been determined, a laser beam with a predefined output power is directed to that position. Fuse 116 is heated by the laser until a portion thin insulation region 114T and a portion of fuse 116 evaporate away to leave two physically separated sections of fuse 116. The two physically separated sections of fuse 116, in turn, provide an open current path between the polysilicon resistive segment RS1 and RS2. FIG. 1C shows semiconductor wafer 110 after fuse 116 has been programmed.

One problem with fuse target 120 is that fuse target 120 is not compatible with the current-generation processes that are used to form copper-topped interconnect structures. To reduce the resistance of a metal interconnect structure, current-generation processes commonly form the top one or more layers of metal traces from copper.

FIGS. 2A-2G show a series of cross-sectional views that illustrate a prior-art method 200 of forming copper traces that lie over a top layer of aluminum traces. As shown in FIG. 2A, method 200 is practiced on a conventionally-formed semiconductor wafer 210 that includes an interconnect structure which has a top layer of aluminum traces 212.

As further shown in FIG. 2A, the method begins by depositing a layer of passivation (non-conductive) material 214, such as a layer of nitride, oxide, or a combination of oxide and nitride, over the top surfaces of the aluminum traces 212. The method continues by forming and patterning a mask 216 on passivation layer 214. Following this, the exposed regions of passivation layer 214 are etched to form openings 220 that expose the top surfaces of the aluminum traces 212 of the interconnect structure. Mask 216 is then removed.

As shown in FIG. 2B, after mask 216 has been removed, a seed layer 222 is formed on passivation layer 214 and the exposed regions of the aluminum traces 212. Seed layer 222 typically includes a layer of titanium (e.g., 300 Å thick) and an overlying layer of copper (e.g., 3000 Å thick). The titanium layer enhances the adhesion between the underlying aluminum traces 212 and the overlying layer of copper. Next, a mask 224 is formed and patterned on seed layer 222 to have a number of openings 226 that expose the number of openings 220.

As shown in FIG. 2C, following the formation and patterning of mask 224, copper is electroplated to form a number of copper traces 230 which each has a top surface 230T. Mask 224 and the seed layer 222 that underlies mask 224 are then removed. Next, as shown in FIG. 2D, a sealant 232 that is resistant to humidity and corrosion, such as cobalt or nickel, is deposited over passivation layer 214 and the copper traces 230. A mask 234 is then formed on sealant 232. The exposed regions of sealant 232 are then removed from the top surface of passivation layer 214 to form a number of sealed copper traces 236. Each sealed copper trace 236, in turn, has a top surface 236T. Mask 234 is then removed.

Alternately, as shown in FIG. 2E, mask 224 can be removed, followed by the deposition of sealant 232 over seed layer 222 and the copper traces 230. Mask 234 is then formed as above. After this, the exposed regions of sealant 232 and the underlying seed layer 222 are removed from the top surface of passivation layer 214 to form the sealed copper traces 236. Mask 234 is then removed.

Next, as shown in FIG. 2F, a layer of non-conductive material (e.g., benzocyclobutene (BCB) or a polymer) 240 is deposited on passivation layer 214 and the sealed copper traces 236. After non-conductive layer 240 has been deposited, a mask 242 is formed on non-conductive layer 240. Following this, the exposed regions of non-conductive layer 240 are etched to form openings 244 that expose selected regions on the top surfaces of the sealed copper traces 236. Mask 242 is then removed.

As shown in FIG. 2G, after the openings 244 in non-conductive layer 240 have been formed, a metal layer 250, such as aluminum or gold, is deposited on non-conductive layer 240 to fill up the openings 244 and contact the selected regions on the top surfaces of the sealed copper traces 236. After this, a mask 252 is formed and patterned on metal layer 250. Next, the exposed regions of metal layer 250 are etched to form a number of metal bond pads 254. Mask 252 is then removed. After mask 252 has been removed, solder balls can be attached to the metal bond pads 254 or, alternately, thin wires can be bonded to the metal bond pads 254.

The problem with method 200 is that when method 200 is applied to a semiconductor wafer that includes an aluminum fuse and an aluminum fuse target, the chemistry used to remove the un-used regions of seed layer 222 also attacks the exposed aluminum of the fuse target. As a result, following the formation of a layer of copper traces, the exposed aluminum of the fuse target, such as fuse target 120, can be damaged to the point of where the optical recognition system can no longer detect the fuse target. When this occurs, the position of the fuse can no longer be identified, and the fuse can no longer be programmed.

As a result, there is a need for a fuse target that is compatible with the current-generation fabrication processes that are used to form copper-topped interconnect structures.

BRIEF DESCRIPTION OF THE DRAWINGS

FIGS. 1A-1C are views illustrating a prior-art semiconductor wafer 110 with a fuse and a fuse target. FIG. 1A is a plan view, while FIGS. 1B and 1C are cross-sectional views taken along line 1B-1B of FIG. 1A.

DETAILED DESCRIPTION OF THE INVENTION

Figure 3A:
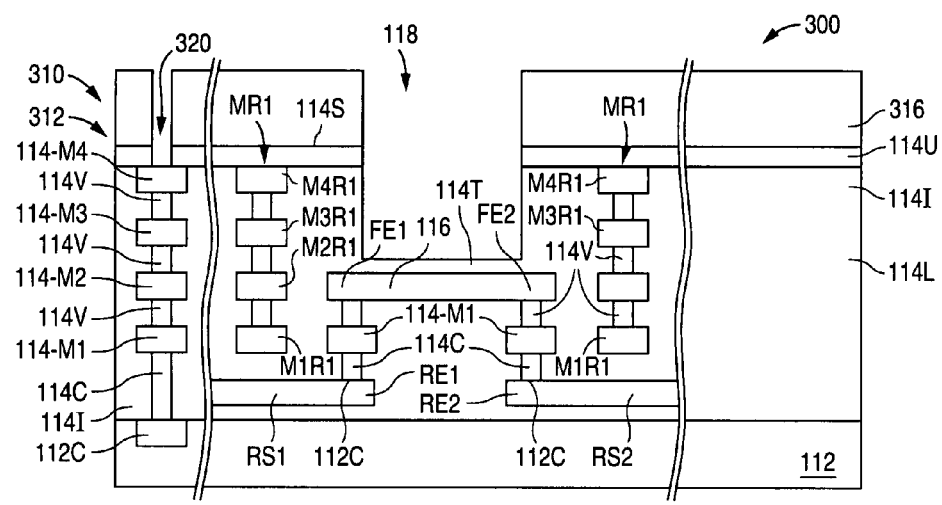
FIGS. 3A-3K are a series of cross-sectional views illustrating a method 300 of forming a fuse target in accordance with the present invention.

FIGS. 3A-3K show a series of cross-sectional views that illustrate a method 300 of forming a fuse target in accordance with the present invention. As shown in FIG. 3A, method 300 utilizes a conventionally-formed semiconductor wafer 310. In the present example, semiconductor wafer 310 is identical to semiconductor wafer 110 except that semiconductor wafer 310 utilizes a metal interconnect structure 312 in lieu of metal interconnect structure 114.

Metal interconnect structure 312, in turn, is identical to metal interconnect structure 114 except that metal interconnect structure 312 utilizes a to-be-described copper-based fuse target in lieu of fuse target 120. As a result, the reference numerals of semiconductor wafer 310 that match the reference numerals of semiconductor wafer 110 identify the same structures as the reference numerals of semiconductor wafer 110.

As shown in FIG. 3A, method 300 begins by forming and patterning a mask 316 on the top surface 114S of passivation layer 114U. Following this, the exposed regions of passivation layer 114U are etched to form a number of passivation openings 320 that expose the top surfaces of the aluminum metal-4 traces 114-M4. (Only one passivation opening 320 is shown for clarity.) The etch also forms opening 118. Mask 316 is then removed.

Figure 3B:
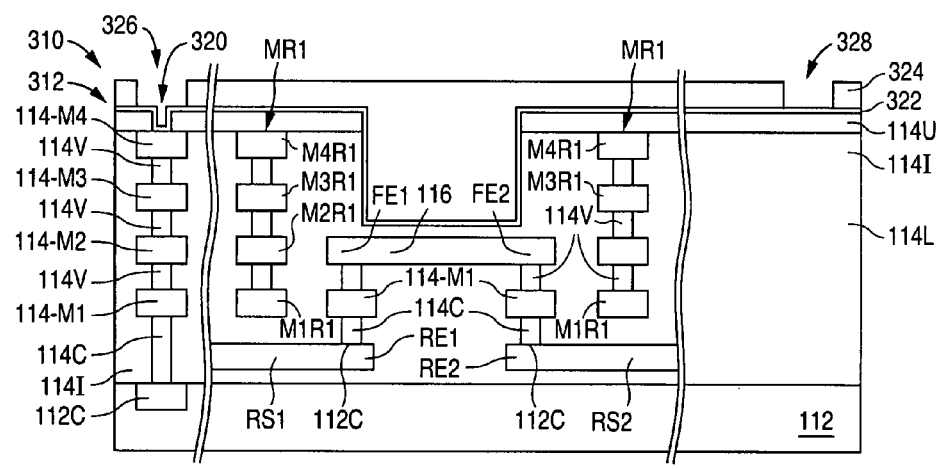

As shown in FIG. 3B, after mask 316 has been removed, a seed layer 322 is formed on insulation region 114I, and the exposed regions of the aluminum metal-4 traces 114-M4. Seed layer 322 typically includes a layer of titanium (e.g., 300 Å thick) and an overlying layer of copper (e.g., 3000 Å thick). The titanium layer enhances the adhesion between the underlying aluminum trace 114-M4 and the overlying layer of copper.

After seed layer 322 has been formed, a mask 324 is formed and patterned on seed layer 322 to have a number of conducting openings 326 that expose the number of passivation openings 320, and to also have a number of target openings 328, e.g., one in each corner of a region that surrounds the fuse banks.

Figure 3C:
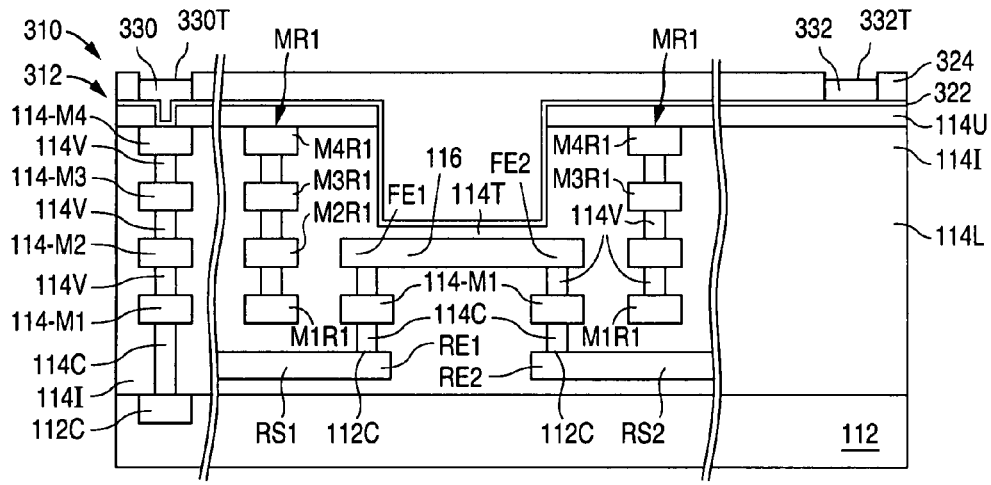

As shown in FIG. 3C, following the formation and patterning of mask 324, copper is electroplated to form a number of spaced-apart copper traces 330 in the openings 320 and 326, and a number of electrically-isolated copper targets 332 in the openings 328. As a result, the copper traces 330 are electrically connected to the top surfaces of the aluminum metal-4 traces 114-M4 by way of seed layer 322. Further, each of the copper traces 330 has a top surface 330T, and each of the copper targets 332 has a top surface 332T. (Only one copper trace 330 and one copper target 332 are shown for clarity.)

Figure 3D:
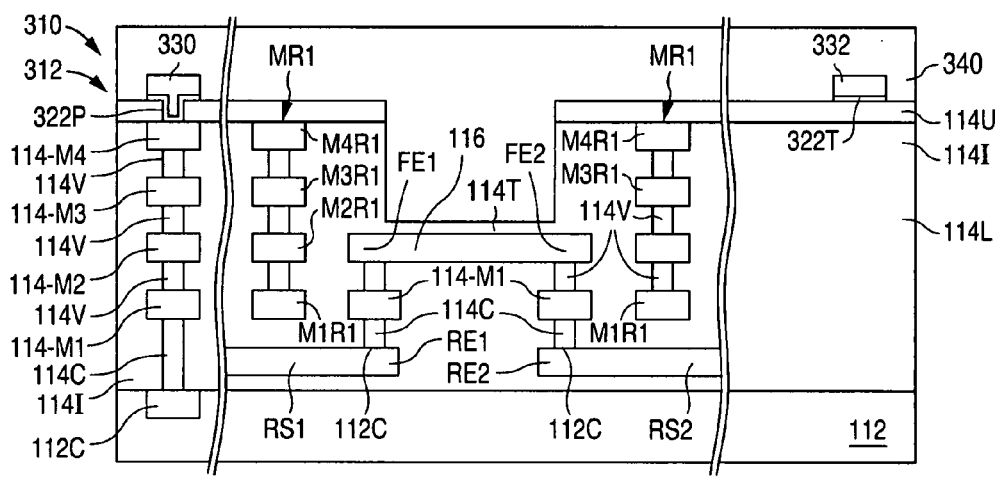

Mask 324 and the seed layer 322 that underlies mask 324 are then removed. As shown in FIG. 3D, the removal of seed layer 322 defines a number of seed portions 322P that contact the top surfaces of the aluminum metal-4 traces 114-M4, passivation layer 114U, and the copper traces 330. The removal of seed layer 322 also defines a number of spaced apart seed targets 322T that contacts passivation layer 114U and the copper targets 332. (Only one seed portion 322P and one seed target 322T are shown for clarity.)

After mask 324 and seed layer 322 have been removed, a layer of non-conductive material 340 is deposited on passivation layer 114U, the copper traces 330, and the copper targets 332. Non-conductive layer 340 can be implemented with, for example, benzocyclobutene (BCB) or a polymer.

Figure 3E:
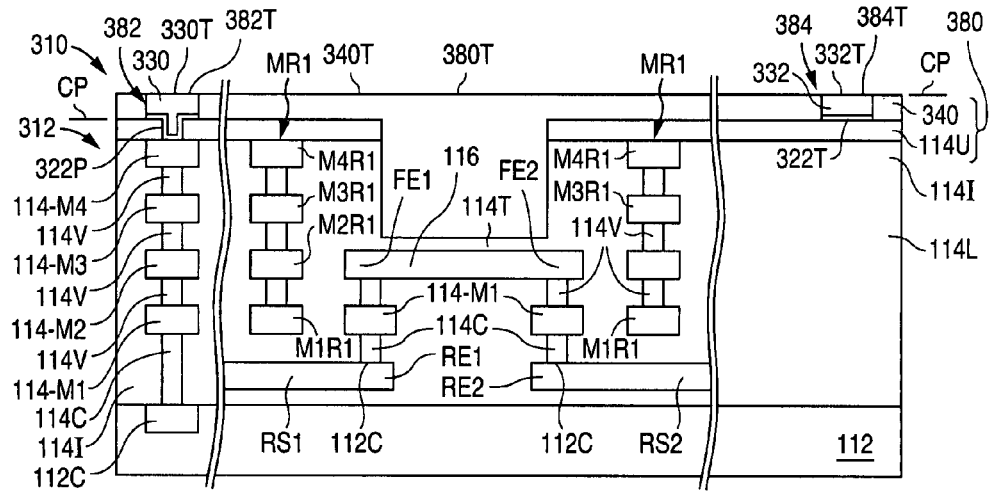

In the present example, once non-conductive layer 340 has been formed, as shown in FIG. 3E, non-conductive layer 340 is planarized until the top surfaces 330T of the copper traces 330 and the top surfaces 332T of the copper targets 332 have been exposed, thereby forming a planarized non-conductive layer 340P. (Other examples are discussed below.) Thus, as shown in the FIG. 3E example, the top surface 330T of each of copper trace 330, the top surface 332T of each copper target 332, and a top surface 340T of planarized non-conductive layer 340P lie in a common horizontal plane CP.

Figure 3F:
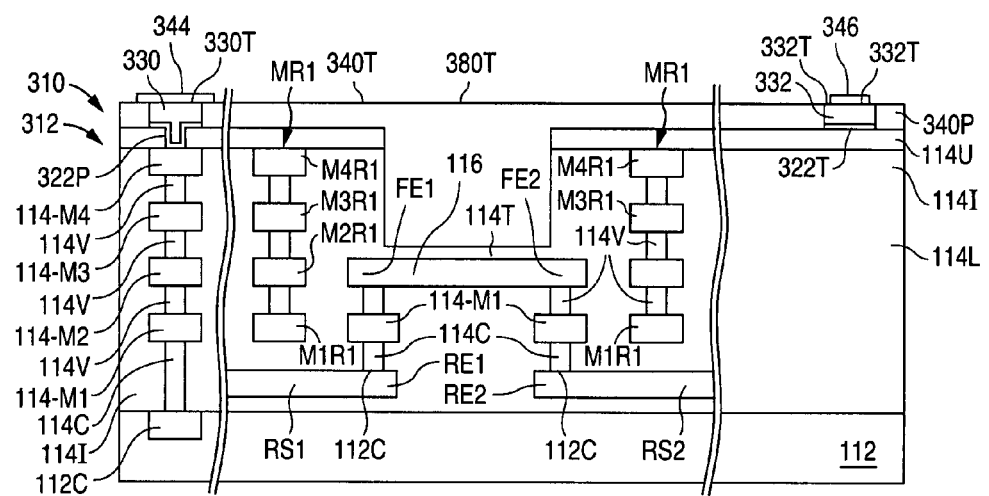

Following this, as shown in FIG. 3F, a metal plate 344 is formed on the top surface 330T of each copper trace 330, and a metal target 346 is formed on the top surface 332T of each copper target 332. As shown, the metal plates 344 and the metal targets 346, which are thin flat layers, are identical except that the metal plates 344 are larger than the top surfaces 330T of the copper traces 330, while the metal targets 346 are smaller than the top surfaces 332T of the copper targets 332.

Figure 4B:
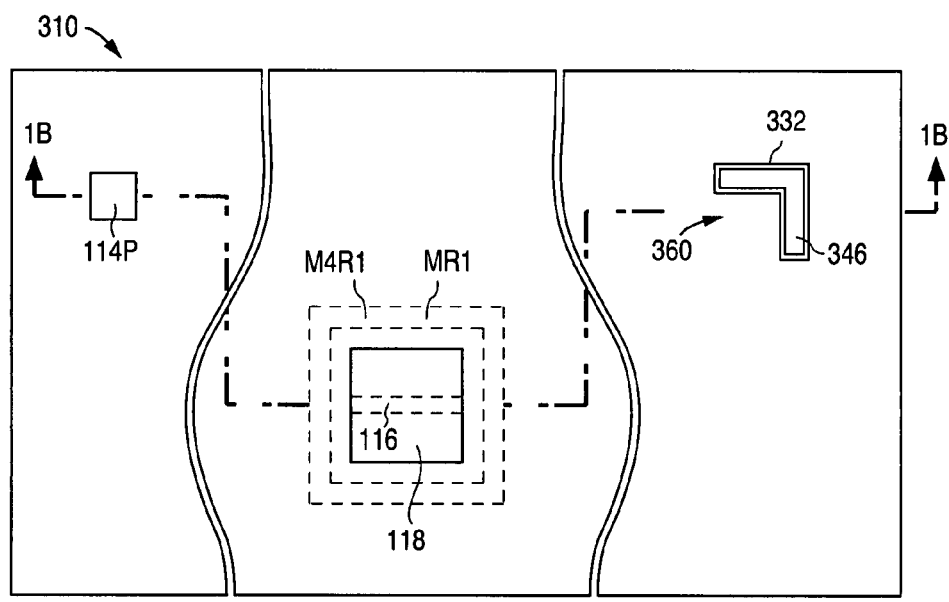
FIG. 4B is a plan view illustrating wafer 310 following the removal of mask 354 in accordance with the present invention.
Figure 4A:
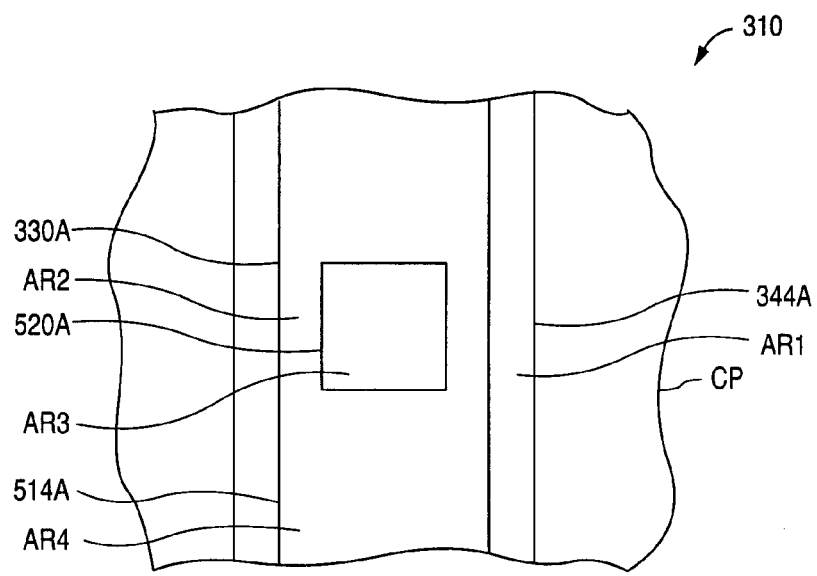
FIG. 4A is a plan view illustrating a region of semiconductor wafer 310 in accordance with the present invention.

FIG. 4A shows a plan view that illustrates a region of semiconductor wafer 310 in accordance with the present invention. As shown in FIG. 4A, the top surface of a metal plate 344A has an area AR1 measured in the common plane CP (which lies parallel to the surface of the page), while the top surface of a copper trace 330A has an area AR2 measured in the common plane CP that is smaller than the area AR1 of metal plate 344A.

By forming metal plate 344A to be larger than the top surface of the copper trace 330A, the need for a sealant can be eliminated. On the other hand, as described in greater detail below, each copper target 332 is part of a to-be-formed fuse target and, as a result, need not be sealed. As a result, the area (measured in the common plane CP) of metal target 346 is less than the area (measured in the common plane CP) of copper target 332 by an amount which is sufficient to ensure that, within the maximum misalignment error, metal target 346 is completely formed on the top surface 332T of copper target 332.

Figure 3G:
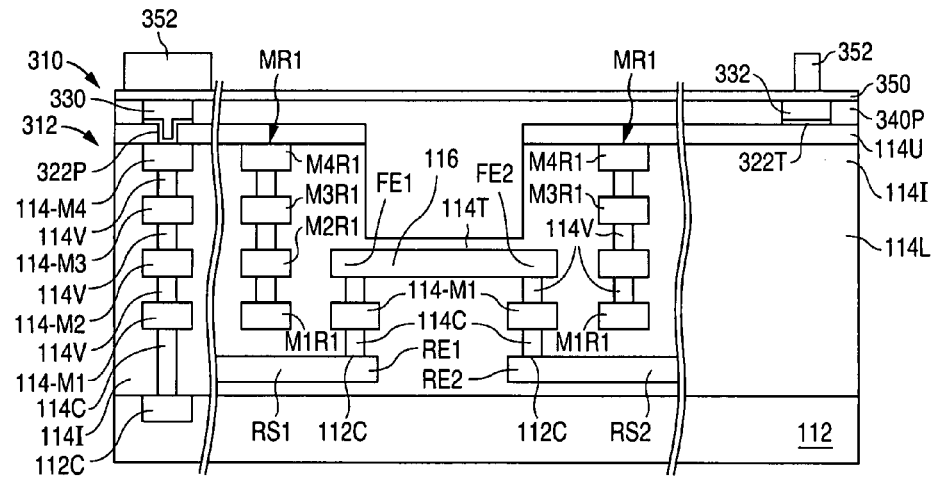

Referring to FIG. 3G, the metal plates 344 and the metal targets 346 can be formed by depositing a metallic layer 350, such as a layer of aluminum, aluminum-copper, or gold (and can optionally include an underlying layer of material, such as titanium, which improves the adhesion of the metallic layer to copper), on planarized non-conductive layer 340P, the copper traces 330, and the copper targets 332. When metallic layer 350 is formed with aluminum-copper, metallic layer 350 has more than 50% aluminum, such as aluminum with 0.5% copper.

Figure 3H:
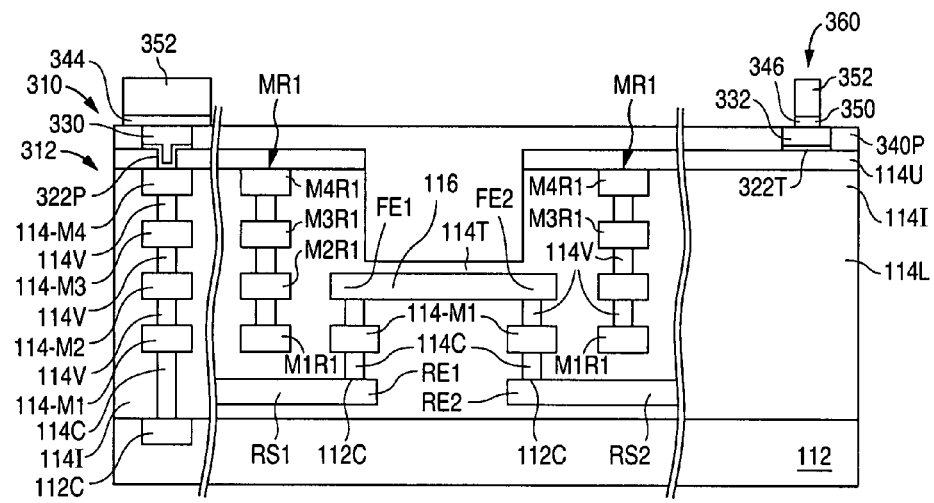

Following the formation of metallic layer 350, a mask 352 is formed and patterned on metallic layer 350. Once mask 352 has been patterned, as shown in FIG. 3H, the exposed regions of metallic layer 350 are etched away to form the metal plates 344 and the metal targets 346. Mask 352 is then removed.

In accordance with the present invention, a seed target 322T, a copper target 332 that lies over and touches the seed target 322T, and a metal target 346 that lies over and touches the copper target 332 form a fuse target 360 that is electrically isolated from all other conducting regions.

Figure 3I:
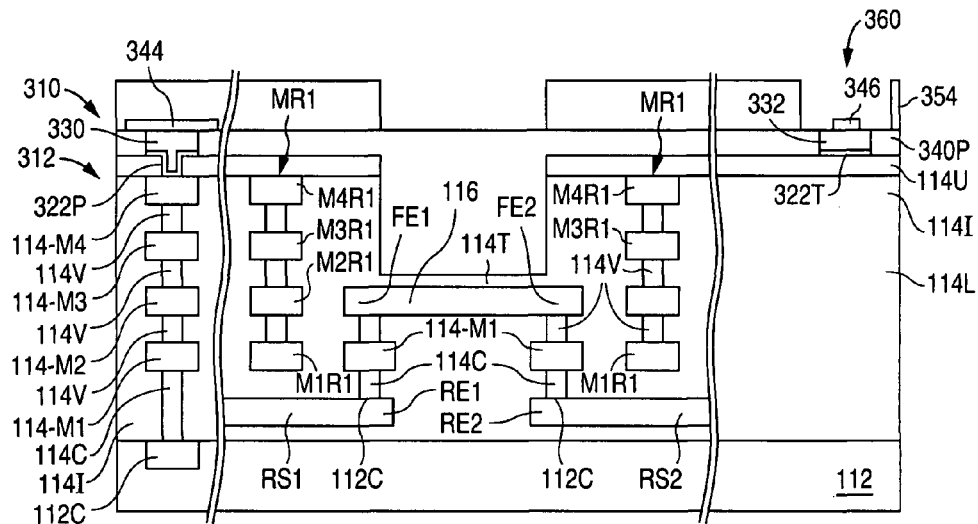
Figure 3J:
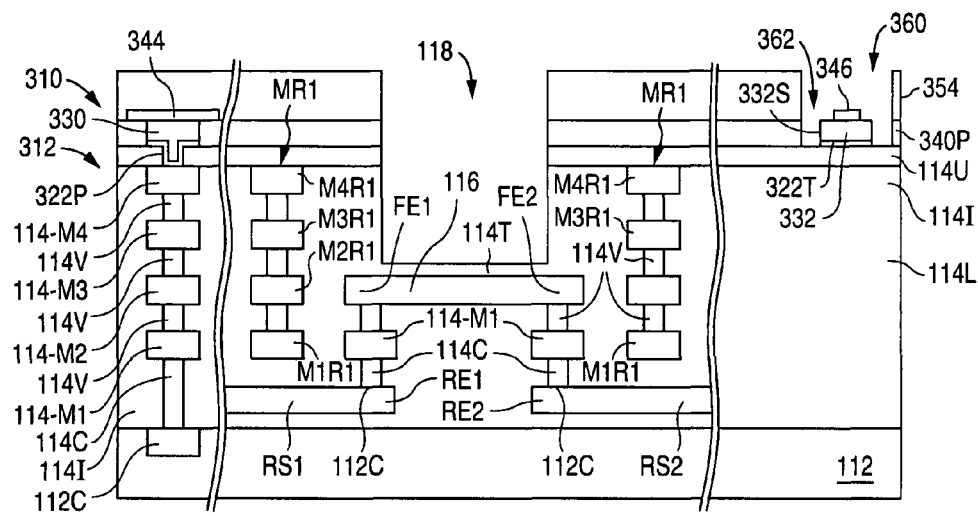

After mask 352 has been removed, as shown in FIG. 3I, a mask 354 is formed and patterned on non-conductive layer 340P, the metal plates 344, and the fuse targets 360. Once mask 354 has been formed and patterned, as shown in FIG. 3J, the exposed regions of planarized non-conductive layer 340P are etched to re-open fuse opening 118. At the same time, the exposed regions of non-conductive layer 340P that lie around each fuse target 360 are etched away. The etch forms a number of trenches 362 that each surrounds a copper target 332 and exposes the side wall 332S of the copper target 332.

One of the advantages of the present invention is that, as shown in FIG. 3J, passivation layer 114U functions as an etch stop which prevents the etch which re-opens fuse opening 118 from etching into the planarized insulation region 114I that lies below fuse target 360. Thus, because fuse target 360 lies above passivation layer 114U, the need for stacked metal ring structure MR2 is eliminated.

Figure 1A:
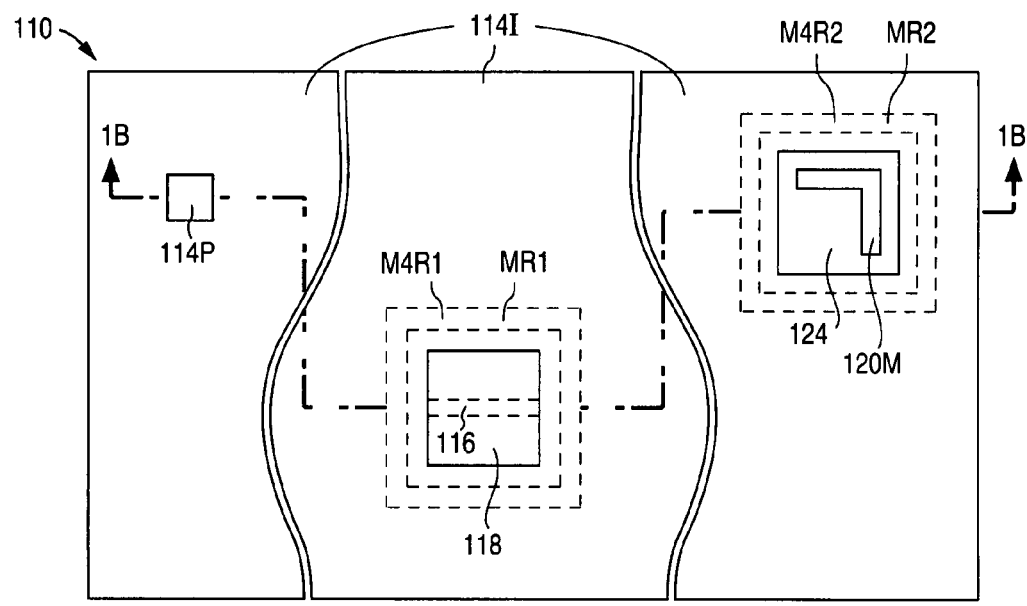

As noted above, stacked metal ring structure MR2 is formed around fuse target 120 shown in FIGS. 1A-1C to protect adjacent regions of wafer 110 from the etch that forms fuse trench 124. In the present invention, passivation layer 114U prevents a fuse trench like fuse trench 124 from being formed. As a result, there is no need for stacked metal ring structure MR2. The elimination of stacked metal ring structure MR2, in turn, increases the space available for other metal interconnect structures.

Figure 3K:
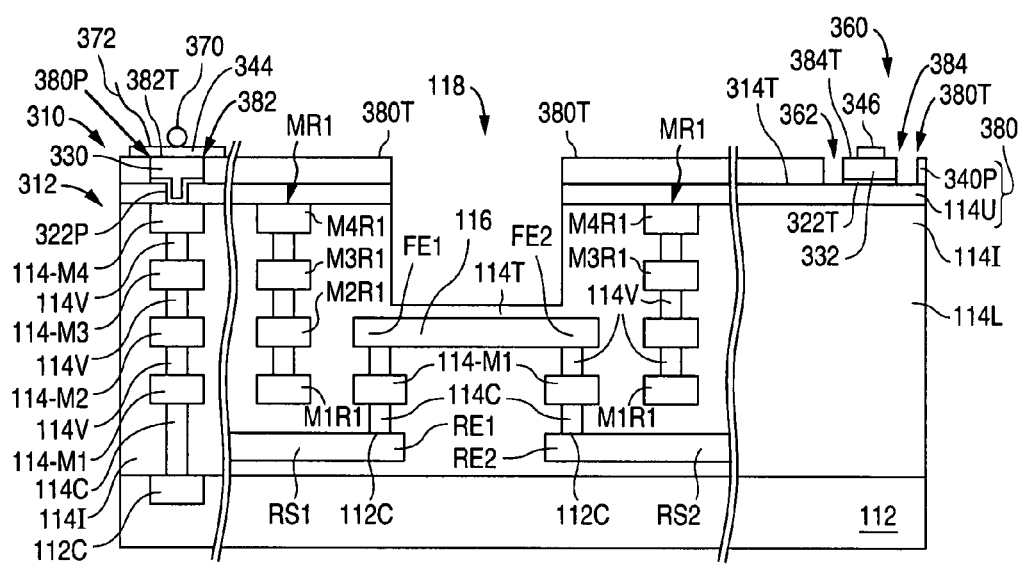

As shown in FIG. 3K, mask 354 is then removed to complete method 300 of the present invention. Alternately, after mask 354 has been removed, solder balls 370 can next be attached to selected regions on the top surfaces of the metal plates 344 as illustrated in FIG. 3K or, thin wires 372 can next be bonded to selected regions on the top surfaces of the metal plates 344 as alternately illustrated in FIG. 3K.

FIG. 4B shows a plan view that illustrates wafer 310 following the removal of mask 354 in accordance with the present invention. As shown in FIGS. 1A and 4B, the view of fuse target 120 and the view of fuse target 360 are substantially identical as seen from the perspective of the optical recognition system. As a result, fuse 116 in wafer 310 is programmed in the same manner as fuse 116 in wafer 110. (The optical recognition system may need to be compensated to accommodate any changes in the vertical separation distance between the fuse target and the optical recognition system.)

Figure 2A:
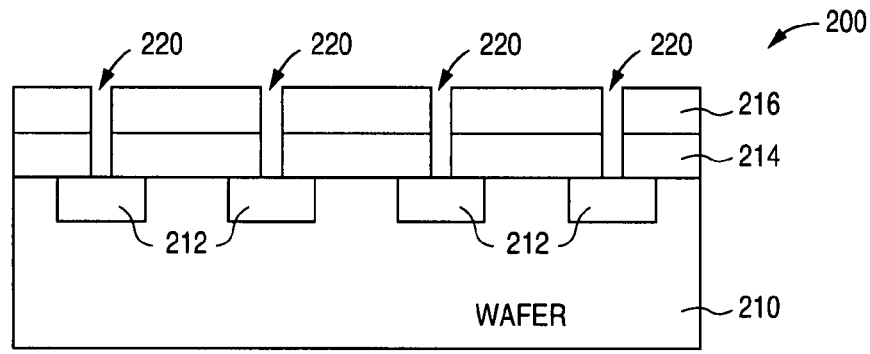
FIGS. 2A-2G are a series of cross-sectional views illustrating a prior-art method 200 of forming a layer of copper traces.
Figure 2B:
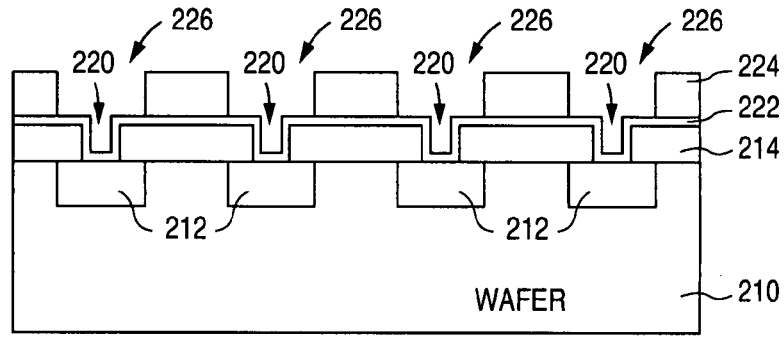
Figure 2C:
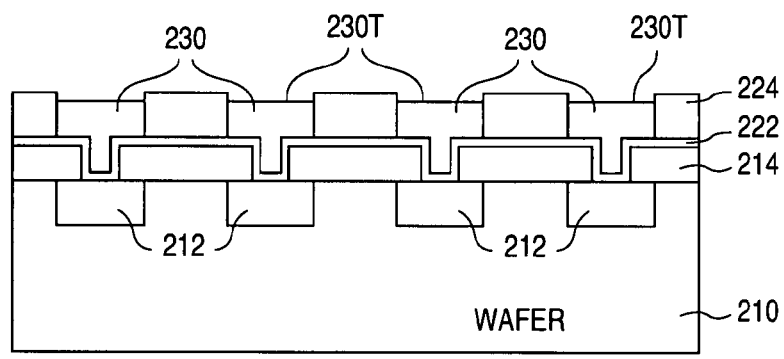
Figure 2D:
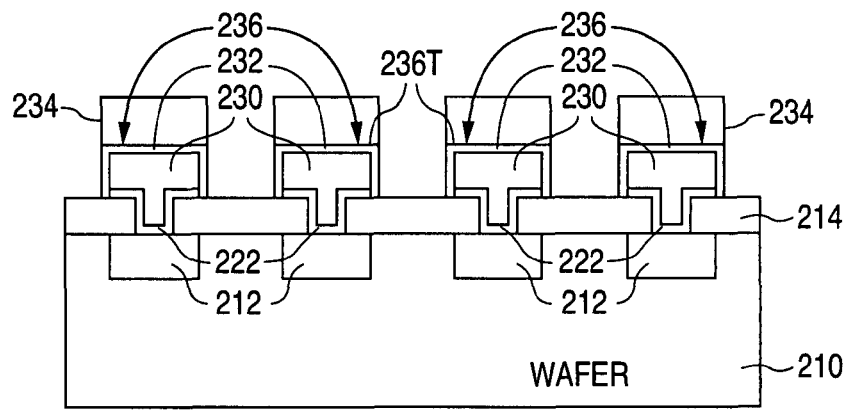
Figure 2E:
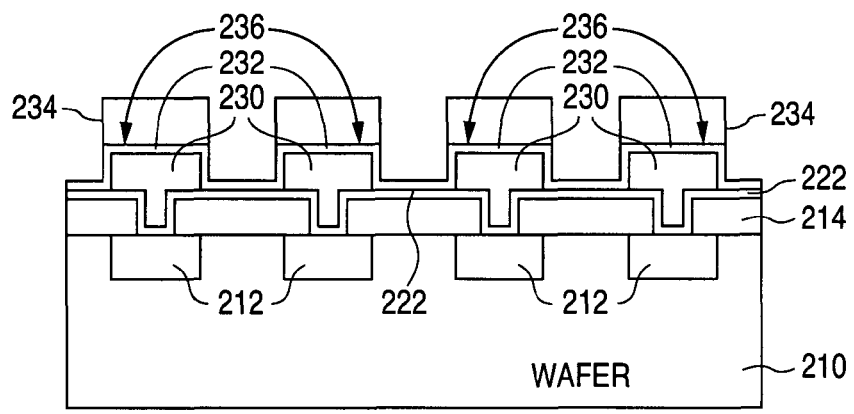
Figure 2F:
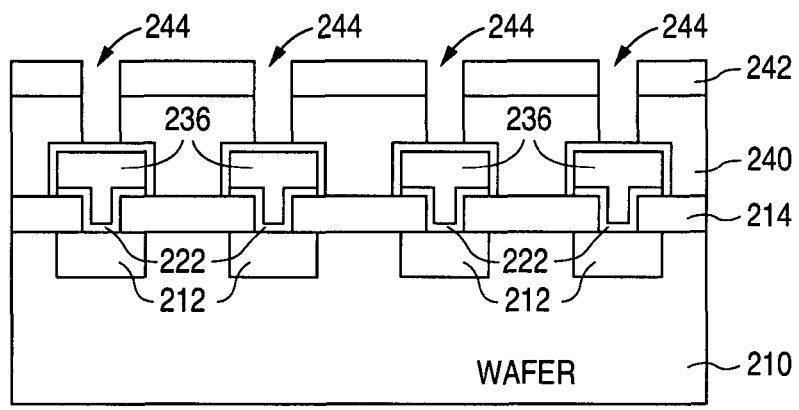
Figure 2G:
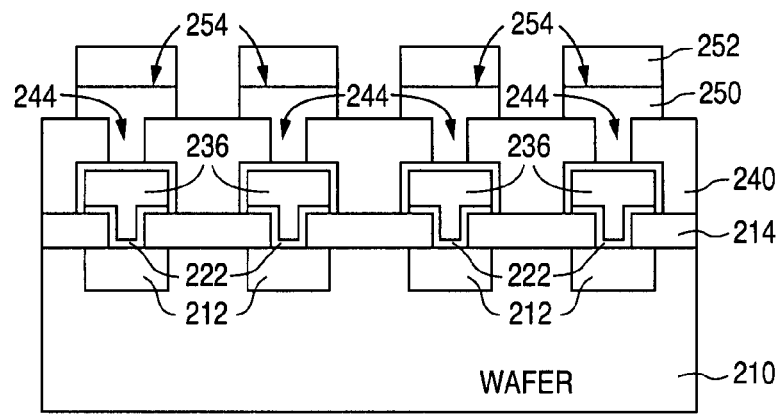

In an alternate embodiment, the method of the present invention can include the sealing steps illustrated in FIG. 2D or 2E. FIGS. 5A-5K show a series of cross-sectional views that illustrate a method 500 of forming a fuse target in accordance with an alternate embodiment of the present invention.

Method 500, when practiced on wafer 310 shown in FIG. 3A, is the same as method 300 up through the formation of the copper traces 330 and the copper targets 332. Method 500 then follows the process described above with respect to FIG. 2D or 2E, to form the sealed copper traces and the sealed copper targets.

With respect to FIG. 2D, once the copper traces 330 and the copper targets 332 have been formed, mask 324 and the underlying seed layer 322 are removed. The removal of seed layer 322 defines the seed portions 322P that contact the top surfaces of the aluminum metal-4 traces 114-M4, passivation layer 114U, and the copper traces 330. The removal of seed layer 322 also defines the seed targets 322T that contact passivation layer 114U and the copper targets 332.

Figure 5A:
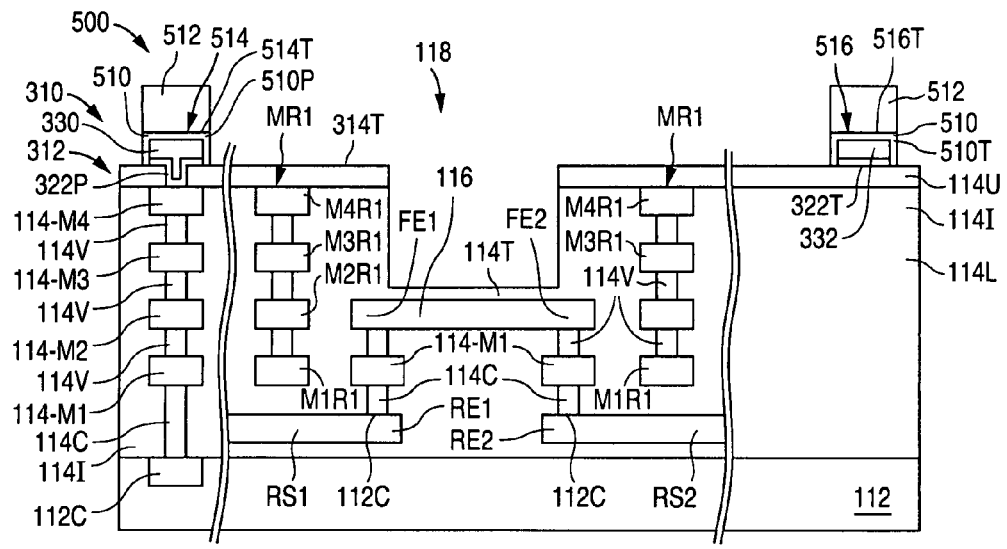
FIGS. 5A-5K are a series of cross-sectional views illustrating a method 500 of forming a copper-compatible fuse target in accordance with an alternate embodiment of the present invention.

As shown in FIG. 5A, after mask 324 and the seed layer 322 that underlies mask 324 have been removed, a sealant layer 510 that is resistant to humidity and corrosion, such as cobalt or nickel, is deposited on passivation layer 114U, the copper traces 330, and the copper targets 332. Following this, a mask 512 is formed and patterned on sealant layer 510.

The exposed regions of sealant layer 510 are then removed from the top surface of passivation layer 114U to form a number of spaced-apart sealant portions 510P and a number of spaced-apart sealant targets 510T. (Only one sealant portion 510P and one sealant target 510T are shown for clarity.) A sealant portion 510P and an underlying copper trace 330, in turn, define a sealed copper trace 514, while a sealant target 510T and an underlying copper target 332 define a sealed copper target 516. Each sealed copper trace 514, which has a top surface 514T, sits on a seed portion 322P. Each sealed copper target 516, which has a top surface 516T, sits on a seed target 322T. Mask 512 is then removed.

Figure 5B:
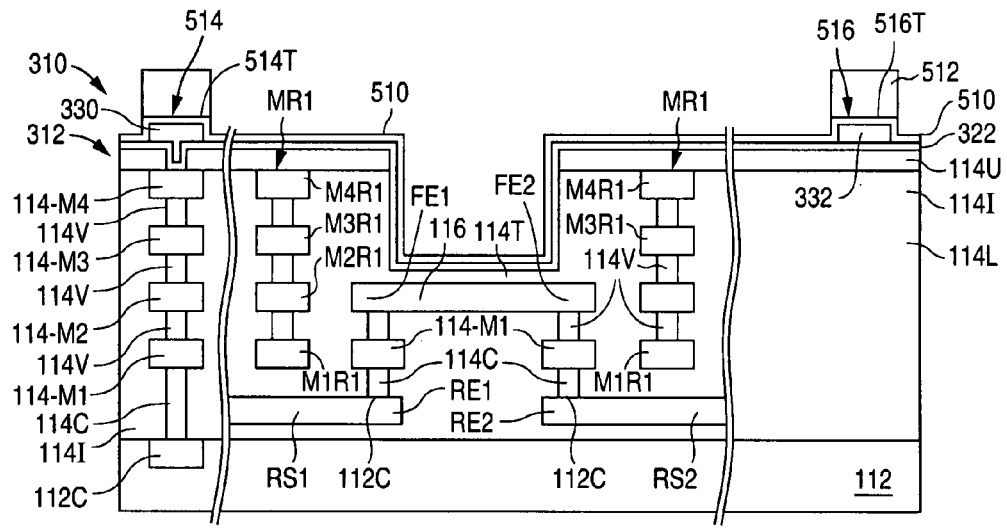

Alternately, as shown in FIG. 5B, mask 324 can be removed, followed by the deposition of sealant layer 510 over seed layer 322, the copper traces 330, and the copper targets 332. Mask 512 is then formed as above. After this, the exposed regions of sealant layer 510 and the underlying seed layer 322 are then removed from the top surface of passivation layer 114U to form the sealant portions 510P, the sealed copper traces 514, and the seed portions 322P. In addition, the etch also forms the sealant targets 510T, the sealed copper targets 516, and the seed targets 322T. Mask 512 is then removed.

Figure 5C:
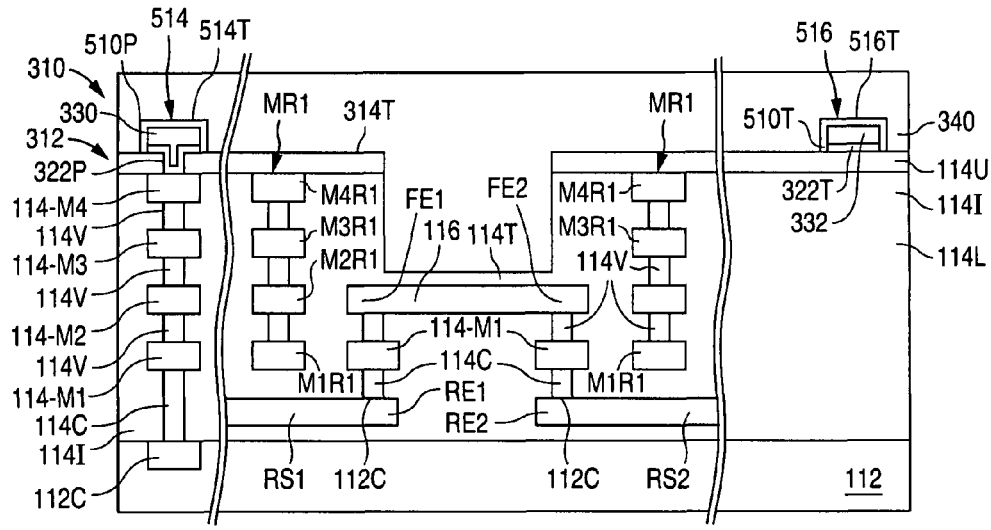
Figure 5D:
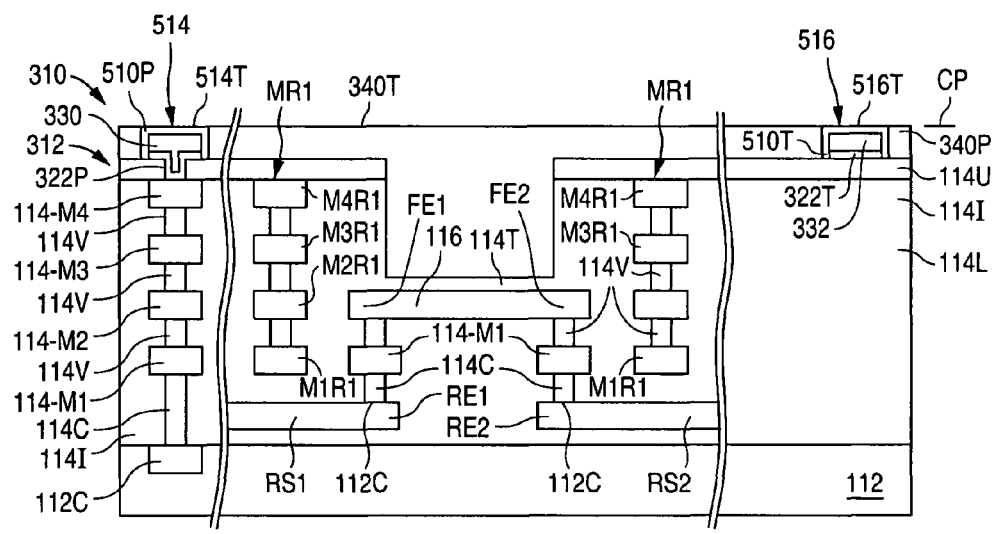

Next, as shown in FIG. 5C, non-conductive layer 340 is formed on the sealed copper traces 514 and the sealed copper targets 516. Once non-conductive layer 340 has been formed, as shown in FIG. 5D, in a first variation, non-conductive layer 340 is planarized until the top surfaces 514T of the sealed copper traces 514 and the top surface 516T of the sealed copper targets 516 have been exposed to form planarized non-conductive layer 340P. Thus, as shown in FIG. 5D, the top surface 514T of each sealed copper trace 514, the top surface 516T of each sealed copper target 516, and a top surface 340T of planarized non-conductive layer 340P lie in the common horizontal plane CP.

Figure 5E:
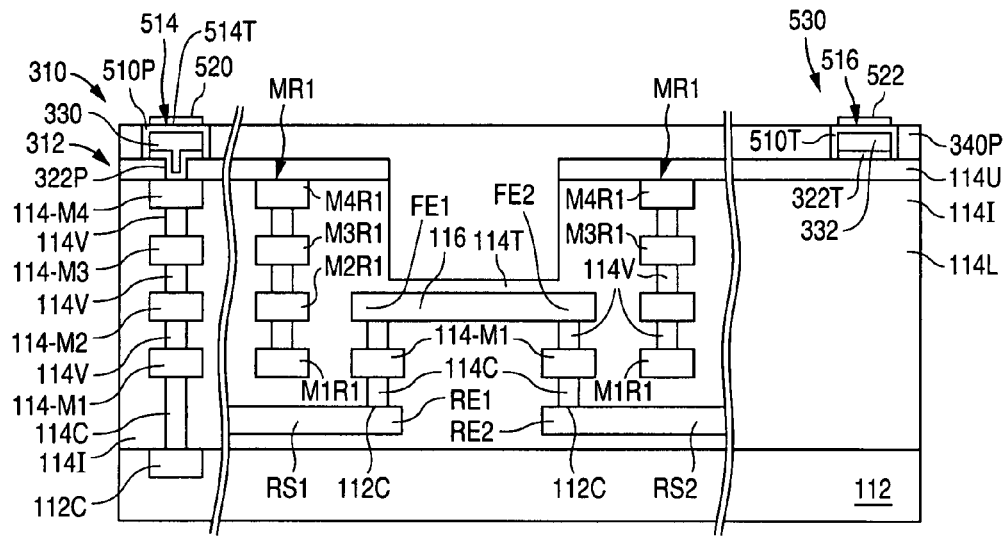

Following this, as shown in FIG. 5E, a number of metal bond pads 520 are formed over selected regions of the top surfaces 514T of the sealed copper traces 514, and a number of metal targets 522 are formed over the sealed copper targets 516. In the alternate embodiment, a seed target 322T, a sealed copper target 516 that lies over and touches the seed target 322T, and a metal target 522 that lies over and touches the copper target 332 form a fuse target 530 that is electrically isolated from all other conducting regions.

The metal bond pads 520 differ from the metal plates 344 in that the metal bond pads 520 are formed over selected regions of the top surfaces 514T of the sealed copper traces 514 rather than over all of the copper traces, and are formed to be less than the same size as the selected regions of the top surfaces 514T of the sealed copper traces 514. Since the copper traces are sealed, the metal bond pads 520 need not cover all of the copper traces, and need not be larger than the selected regions of the top surfaces 514T of the sealed copper traces 514 to provide sealing, but can be smaller to accommodate any misalignment error. The metal targets 522, in turn, are substantially identical to the metal targets 346.

As shown in FIG. 4A, the top surface of a metal bond pad 520A can have an area AR3 that is less than an area AR4 of the top surface of a sealed copper trace 514A. Metal bond pads 520 allow a greater density of metal traces to be used.

Figure 5F:
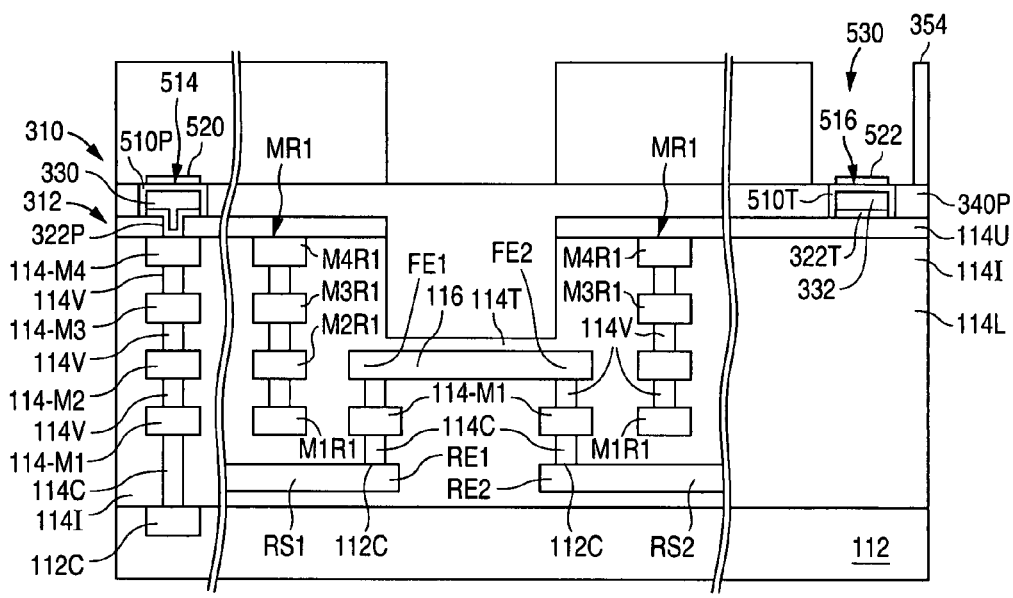
Figure 5G:
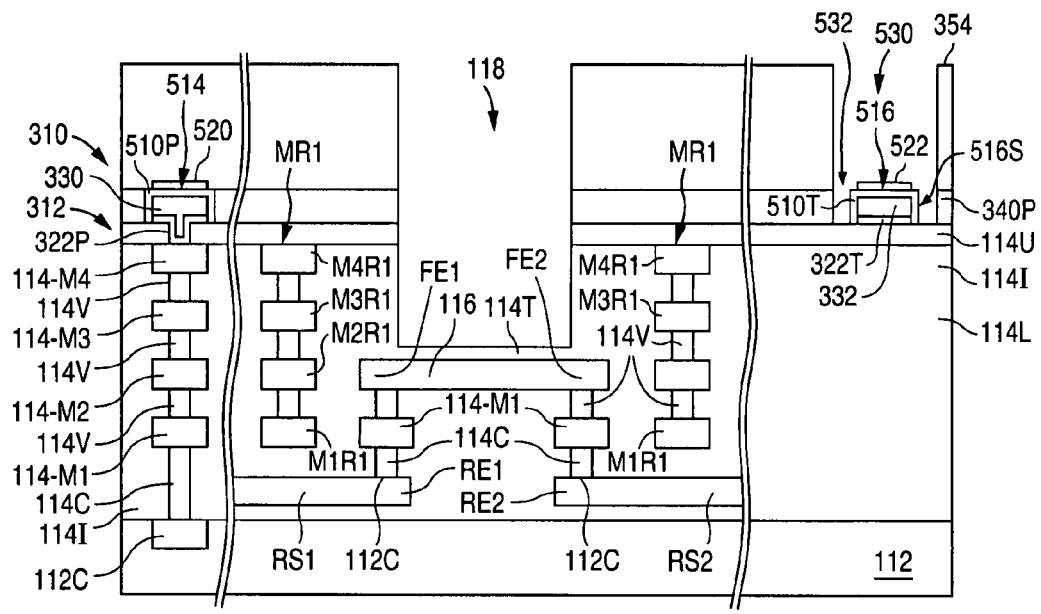

Referring to FIG. 5F, after the metal bond pads 520 and the metal targets 522 have been formed, a mask 354 is formed and patterned on non-conductive layer 340P, the metal bond pads 520, and the fuse targets 530. Once mask 354 has been formed and patterned, as shown in FIG. 5G, the exposed regions of planarized non-conductive layer 340P are etched to re-open fuse opening 118.

Figure 5H:
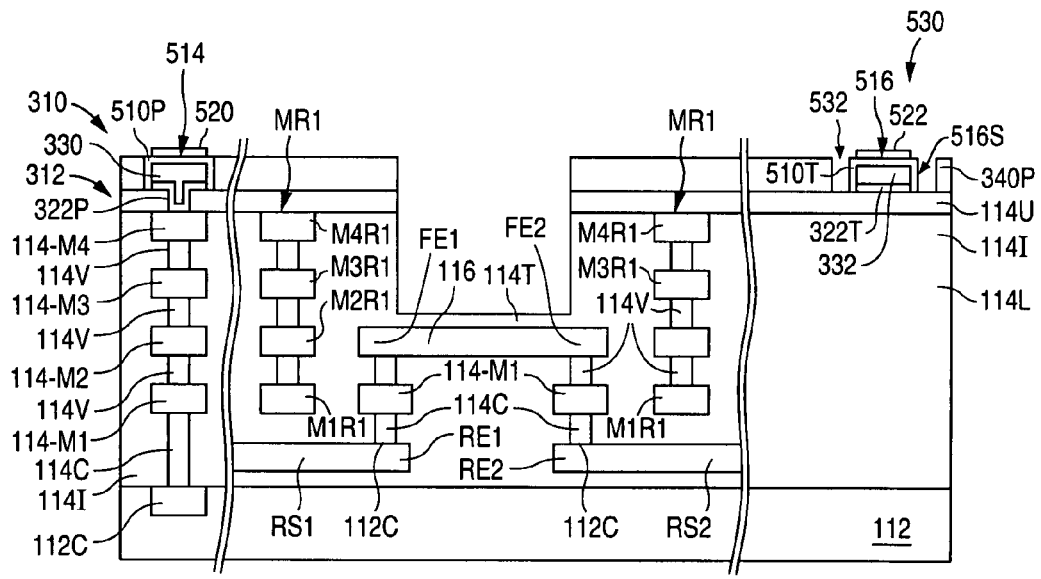

At the same time, the exposed regions of non-conductive layer 340P that lie around each fuse target 530 are etched away. The etch forms a number of trenches 532 that surrounds the sealed copper targets 516 and exposes the side walls 516S of the sealed copper targets 516. As shown in FIG. 5H, mask 354 is then removed to complete method 500 of the present invention. Alternately, after mask 354 has been removed, solder balls can next be attached to the metal bond pads 520 or, thin wires can next be bonded to the metal bond pads 520.

Figure 5I:
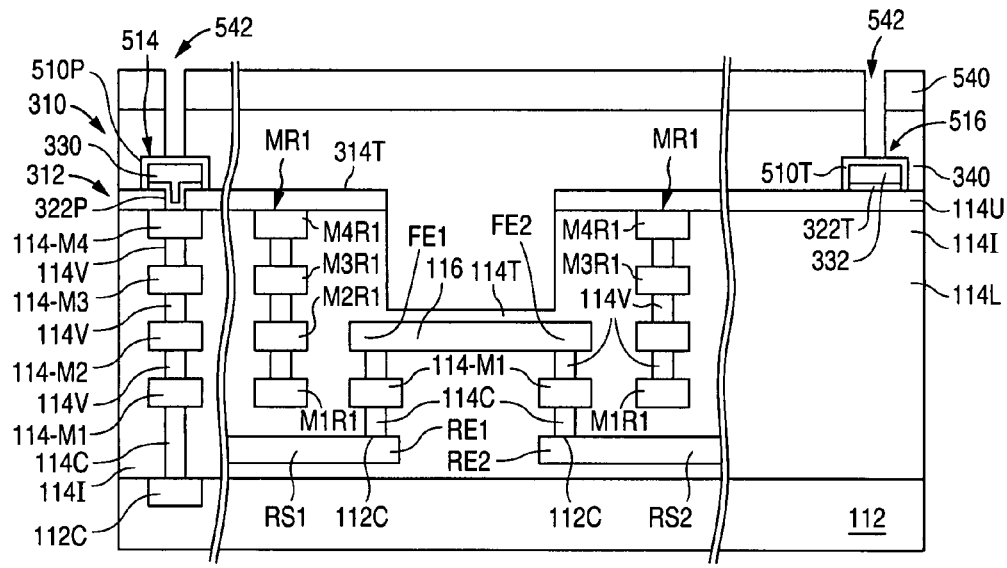

As noted above, in a first variation, non-conductive layer 340 is planarized as shown in FIG. 5D. In a second variation, as shown in FIG. 5I, after second non-conductive layer 340 has been deposited, a mask 540 is formed on non-conductive layer 340. Following this, the exposed regions of non-conductive layer 340 are etched to form openings 542 that expose the sealed copper traces 514 and the sealed copper targets 516. Mask 540 is then removed.

Figure 5J:
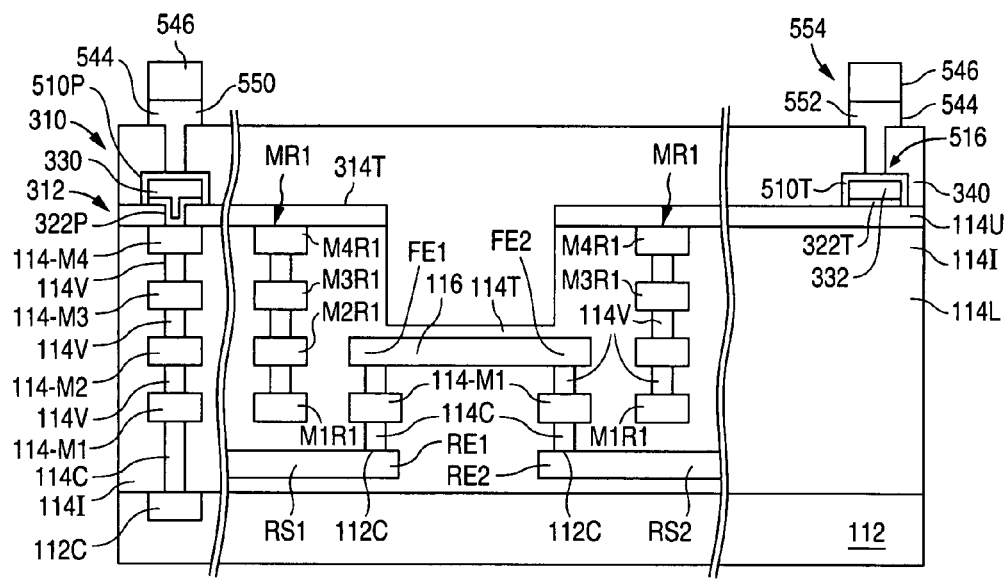

As shown in FIG. 5J, after the openings 542 in non-conductive layer 340 have been formed, a metal layer 544, such as aluminum, aluminum-copper, or gold (and can optionally include an underlying layer of material, such as titanium, which improves the adhesion of the metallic layer to sealed copper), is deposited on non-conductive layer 340 to fill up the openings 542 and contact the sealed copper traces 514 and the sealed copper targets 516. After this, a mask 546 is formed and patterned on metal layer 544. Next, the exposed regions of metal layer 544 are etched to form a number of metal bond pads 550 and a number of metal targets 552. Mask 546 is then removed.

In the second version, a seed target 322T, a sealed copper target 516 that lies over and touches the seed target 322T, and a metal target 552 that lies over and touches the sealed copper target 516 form a fuse target 554 that is electrically isolated from all other conducting regions.

Figure 5K:
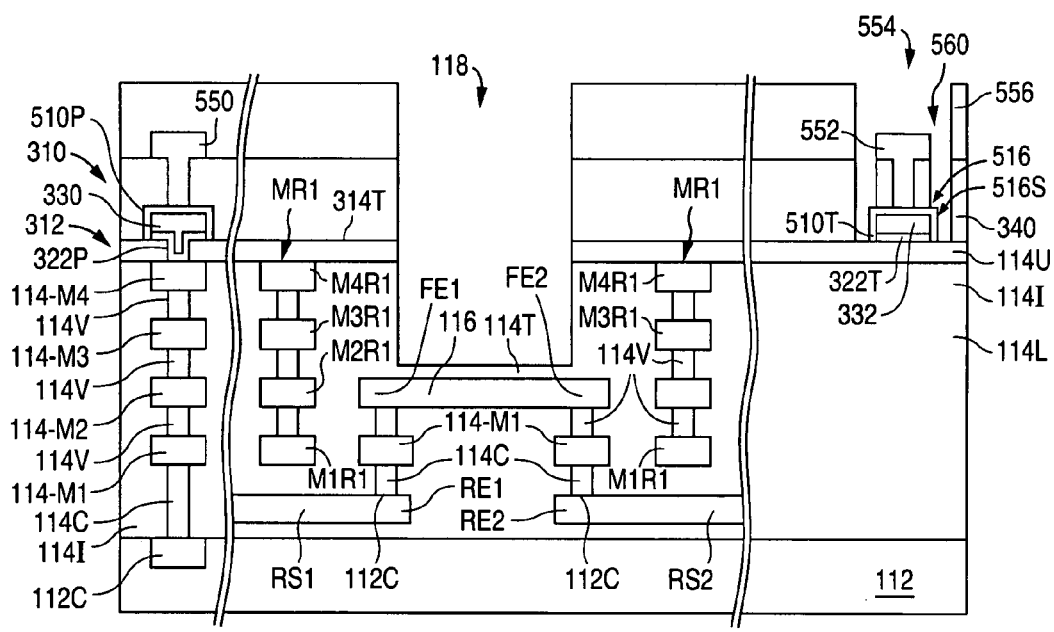

After mask 546 has been removed, as shown in FIG. 5K, a mask 556 is formed and patterned on non-conductive layer 340, the bond pads 550, and the metal targets 552. Once mask 556 has been formed and patterned, the exposed region of planarized non-conductive layer 340 is etched to re-open fuse opening 118.

At the same time, the exposed regions of non-conductive layer 340 that lie around each fuse target 554 are etched away. The etch forms a number of trenches 560 that surrounds the sealed copper targets 516 and exposes the side walls 516S of the sealed copper targets 516. Mask 556 is then removed to complete method 500 of the present invention. Alternately, after mask 556 has been removed, solder balls can next be attached to the metal bond pads 550 or, thin wires can next be bonded to the metal bond pads 550.

Thus, a method of forming a fuse target has been described. As shown in FIG. 3K, semiconductor wafer 310 has an isolation structure 380 that includes passivation layer 114U and non-conductive layer 340P. In addition, isolation structure 380 has a top surface 380T, a number of isolation openings 380P that expose the aluminum traces 114-M4, and a number of target openings 380T that expose no conducting region. (Only one isolation opening 380P and one target opening 380T are shown for clarity.)

As shown in FIG. 3K, wafer 310 also has a number of connection structures 382 that lie in the isolation openings 380P and touch the isolation structure 380 and the aluminum traces 114-M4. Each connection structure 382 has a top surface 382T. A connection structure 382 can be implemented with a seed portion 322P and an overlying copper trace 330, or with a seed portion 322P, an overlying copper trace 330, and an overlying sealant portion 510P.

Wafer 310 also has a target structure 384 that lies in target opening 380T. Target structure 384 has a top surface 384T, and can be implemented with a seed target 322T and a copper target 332, or with a seed target 322T, a copper target 322, and a sealant target 510T. In the present invention, as shown in FIG. 3E, the top surface 382T of each connection structure 382, the top surface 384T of each target structure 384, and the top surface 380T of the isolation structure 380 lie in the common plane CP.

Further, as shown in FIG. 3K, wafer 310 has a number of spaced-apart metal plates 344 and a number of spaced-apart metal targets 346. (One only plate 344 and one target 346 are shown for clarity.) The metal plates 344 touch the top surfaces 382T of the connection structures 382. The metal targets 346 touch the top surfaces 384T of the target structures 384. A target structure 384 and a metal target 346 define fuse target 360, which is electrically isolated from all other conducting regions.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
   a first non-conductive layer having a top surface;
   a first metallic structure touching and lying over the top surface of the first non-conductive layer;
   a second metallic structure being spaced apart from the first metallic structure, touching the top surface of the first non-conductive layer, and being electrically isolated from all other conductive structures;
   a second non-conductive layer touching the first metallic structure, having a bottom surface that touches the top surface of the first non-conductive layer, and being spaced apart from all portions of the second metallic structure; and
   an opening extending completely through the second non-conductive layer, the opening exposing the first non-conductive layer, no portion of the opening exposing the second metallic structure.

2. The semiconductor structure of claim 1 wherein the second non-conductive layer is different from the first non-conductive layer.

3. The semiconductor structure of claim 1 wherein no portion of the second metallic structure lies below the top surface of the first non-conductive layer.

4. The semiconductor structure of claim 1 wherein the opening exposes no conductive structure.

5. The semiconductor structure of claim 1 wherein the first metallic structure includes copper, and the second metallic structure includes copper.

6. The semiconductor structure of claim 1 and further comprising a bonding wire connected to the first metallic structure.

7. A semiconductor structure comprising:
   a first non-conductive layer having a top surface;
   a first metallic structure touching and lying over the top surface of the first non-conductive layer;
   a second metallic structure being spaced apart from the first metallic structure, touching the top surface of the first non-conductive layer, and being electrically isolated from all other conductive structures; and
   a second non-conductive layer touching the first metallic structure, having a bottom surface that touches the top surface of the first non-conductive layer, being spaced apart from all portions of the second metallic structure, and having a first opening and a second opening spaced apart from the first opening, the first opening exposing the second metallic structure, the second opening exposing the first non-conductive layer, no portion of the second opening exposing the second metallic structure.

8. The semiconductor structure of claim 7 wherein the second non-conductive layer is different from the first non-conductive layer.

9. The semiconductor structure of claim 7 wherein no portion of the second metallic structure lies below the top surface of the first non-conductive layer.

10. The semiconductor structure of claim 7 wherein the second opening exposes no conductive structure.

11. The semiconductor structure of claim 7 wherein the first metallic structure includes copper, and the second metallic structure includes copper.

12. The semiconductor structure of claim 7 and further comprising a bonding wire connected to the first metallic structure.

13. A semiconductor structure comprising:
- a first metallic structure having a top surface;
- a first non-conductive layer having a top surface and a bottom surface, the bottom surface of the first non-conductive layer touching the top surface of the first metallic structure, the top surface of the first metallic structure and the bottom surface of the first non-conductive layer lying substantially in a single horizontal plane such that no portion of the first non-conductive layer lies below the single horizontal plane, no surface of the first non-conductive layer lying above the top surface of the first non-conductive layer;
- a second non-conductive layer touching the top surface of the first non-conductive layer;
- a second metallic structure touching the first non-conductive layer, the second non-conductive layer, and the top surface of the first metallic structure;
- a third metallic structure touching and lying above the top surface of the first non-conductive layer, and being electrically isolated from all other conductive structures; and
- an opening extending completely through the second non-conductive layer, no portion of the opening exposing any metallic structure that lies above the first non-conductive layer.

14. The semiconductor structure of claim 13 wherein the second non-conductive layer has an opening that exposes the third metallic structure.

15. The semiconductor structure of claim 13 wherein the second non-conductive layer is different from the first non-conductive layer.

16. The semiconductor structure of claim 13 wherein no portion of the third metallic structure lies below the top surface of the first non-conductive layer.

17. The semiconductor structure of claim 13 wherein the second metallic structure includes copper, and the third metallic structure includes copper.

18. The semiconductor structure of claim 13 and further comprising a wire bonded to the second metallic structure.

* * * * *